(12) United States Patent
Kim

(10) Patent No.: US 6,259,649 B1
(45) Date of Patent: Jul. 10, 2001

(54) SEMICONDUCTOR MEMORY CIRCUIT LAYOUT CAPABLE OF REDUCING THE NUMBER OF WIRES

(75) Inventor: Jae-Woon Kim, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/617,278

(22) Filed: Jul. 17, 2000

(30) Foreign Application Priority Data

Jan. 7, 2000 (KR) .................................................. 617/2000

(51) Int. Cl.$^7$ ....................................................... G11C 8/00
(52) U.S. Cl. ............................................. 365/233; 365/236
(58) Field of Search ................................ 365/51, 63, 233, 365/236

(56) References Cited

U.S. PATENT DOCUMENTS 4,618,947 * 10/1986 Tran et al. ........................... 365/236
5,721,859 * 2/1998 Manning ............................... 365/233
6,052,331 * 4/2000 Araki et al. ........................... 365/233
6,088,252 * 7/2000 Fujisawa et al. ....................... 365/51

* cited by examiner

Primary Examiner—Trong Phan

(57) ABSTRACT

The present invention relates to a semiconductor memory circuit capable of reducing the number of routes to decrease the area of a chip. In a construction of a synchronous semiconductor memory circuit with a LOC architecture in accordance with the present invention including a peripheral circuit block in which an address pad and an input/output pad are arranged at the left and right sides of a chip, respectively, an address counter is placed at the center of the address pad, a first address decoder is placed at the address pad, a second address decoder is placed at the input/output pad, a first address counter buffer for driving the first address decoder upon receipt of the output of the address counter is placed adjacent to the address counter between the address counter and the first address decoder, and a second address counter buffer for driving the second address decoder upon receipt of the output of the address counter is placed at the center of the chip.

8 Claims, 3 Drawing Sheets

SEMICONDUCTOR MEMORY CIRCUIT LAYOUT CAPABLE OF REDUCING THE NUMBER OF WIRES

BACKGROUND OF THE INVENTION

1. Field of the Invention

The present invention relates to a semiconductor memory circuit and, in particular, to a semiconductor memory circuit layout capable of reducing the number of wires on the layout of a semiconductor memory.

2. Description of the Prior Art

FIG. 1 illustrates a semiconductor memory with a conventional Lead-On-Chip(LOC) architecture which is equipped with a peripheral circuit block 10 for applying data, control signals or address signals between a plurality of memory cell arrays for storing data.

As shown therein, the peripheral circuit block 10 includes an input/output pad 15 for inputting and outputting data to be stored in memory cells, an address and control pad 14 for inputting an address signal and a control signal, an address counter 12 for counting the address signal, address counter buffers 13-L and 13-R for buffering the address signal applied from the address counter 12, and address decoders 11-L and 1 for decoding the inputted address signal.

A general synchronous semiconductor memory requires the address counter 12 for counting from a certain particular address. In order to transmit the output of the address counter 12 to the address decoders 11-L and 11-R, buffering is performed using the buffers 13-L and 13-R.

Generally, when a pad type memory with a LOC architecture is used, the address counter 12 is placed at the center of the address pad 14. This is for maintaining the setup and hold margin between an address input pad and a clock pad.

Therefore, the address counter 12 is not placed at the center of a chip, but placed at the center of the address pad 14. The output of the address counter 12 is buffered by the two address counter buffers 13-L and 13-R at the center of a chip and then transmitted to the address decoders 11-L and 11-R at the left and right sides of the chip, respectively.

Herein, the reason why the address counter buffers 13-L and 13-R are placed at the center of the chip is to transmit a counter output of the same load to the address decoders 11-L and 11-R at both sides.

Especially, as the capacity of the semiconductor memory becomes larger, the distance between the address counter 12 and the address decoders 11-L and 11-R is lengthened, so that the necessity for the address counter buffers 13-L and 13-R increases.

In the layout of the above-described semiconductor memory chip, the layout area of an unit circuit block has been a primary factor in determining the size of the entire chip in the conventional art. However, as the semiconductor memory is highly-integrated, the routing between unit circuit blocks becomes a primary factor in determining the size of the chip rather than the layout area of an unit circuit block.

However, in the case of using a conventional technique as illustrated in FIG. 1, there is a problem that since $2A_N(A_N$ number of addresses) number of wires is required at the left portion of the chip at which the output of the address counter 12 and the output of the left address counter buffer 13-L overlap and accordingly the number of wires is increased by $A_N$ compared to the right portion of the chip, the size of the chip is increased as much.

SUMMARY OF THE INVENTION

Accordingly, it is an object of the present invention to provide a semiconductor memory circuit capable of reducing the number of wires by differentiating the layout of address counter buffers.

To achieve the above objects, there is provided a synchronous semiconductor memory circuit with a LOC architecture including a peripheral circuit block in which an address pad and an input/output pad are arranged at the left and right sides of a chip, respectively, wherein an address counter is placed at the center of the address pad, a first address decoder is placed at the address pad, a second address decoder is placed at the input/output pad, a first address counter buffer for driving the first address decoder upon receipt of the output of the address counter is placed adjacent to the address counter between the address counter and the first address decoder, and a second address counter buffer for driving the second address decoder upon receipt of the output of the address counter is placed at the center of the chip.

BRIEF DESCRIPTION OF THE INVENTION

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The preferred embodiments of the present invention will be described in detail with reference to the accompanying drawings.

Figure 1:
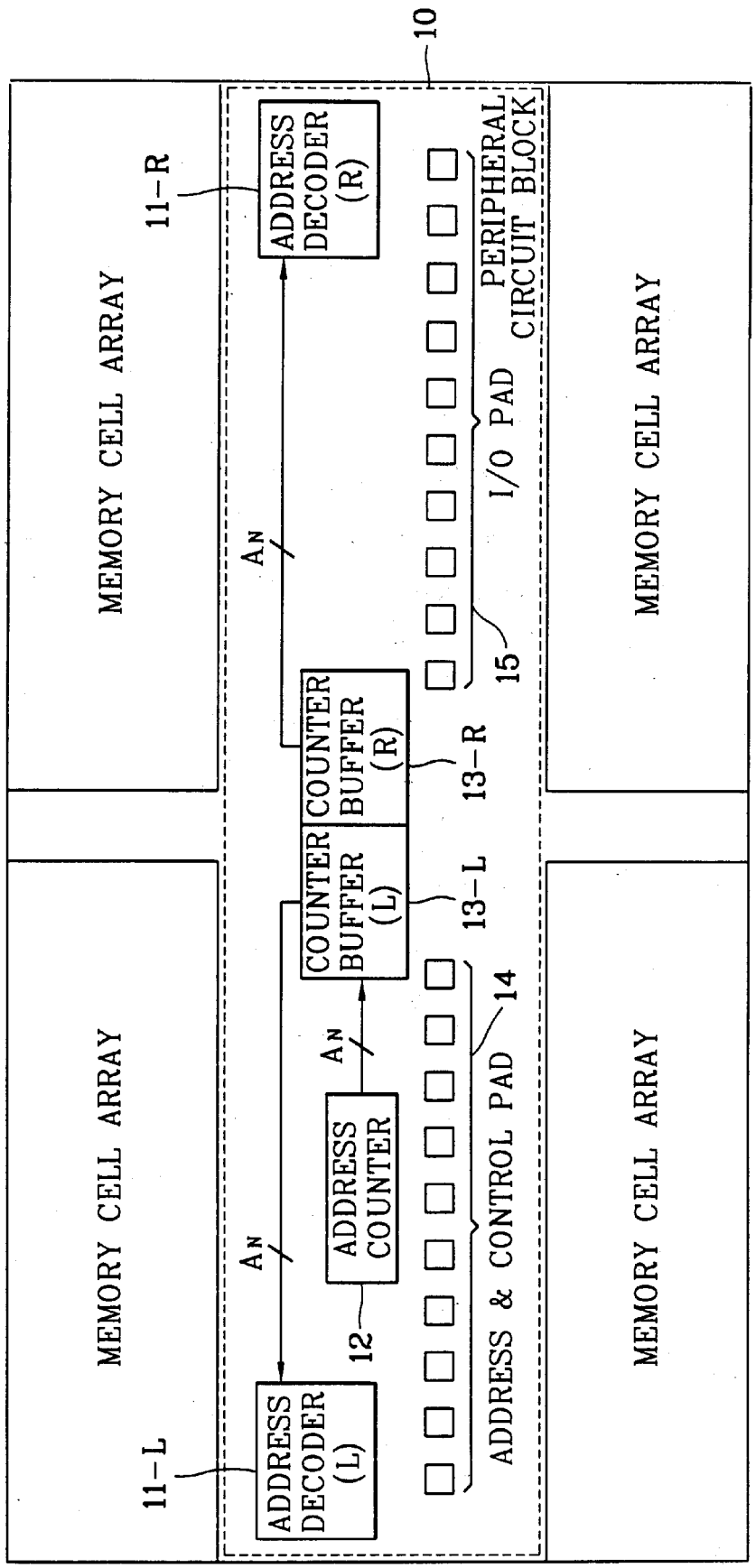
FIG. 1 is a schematic block diagram illustrating a semiconductor memory circuit with a conventional LOC architecture.
Figure 2:
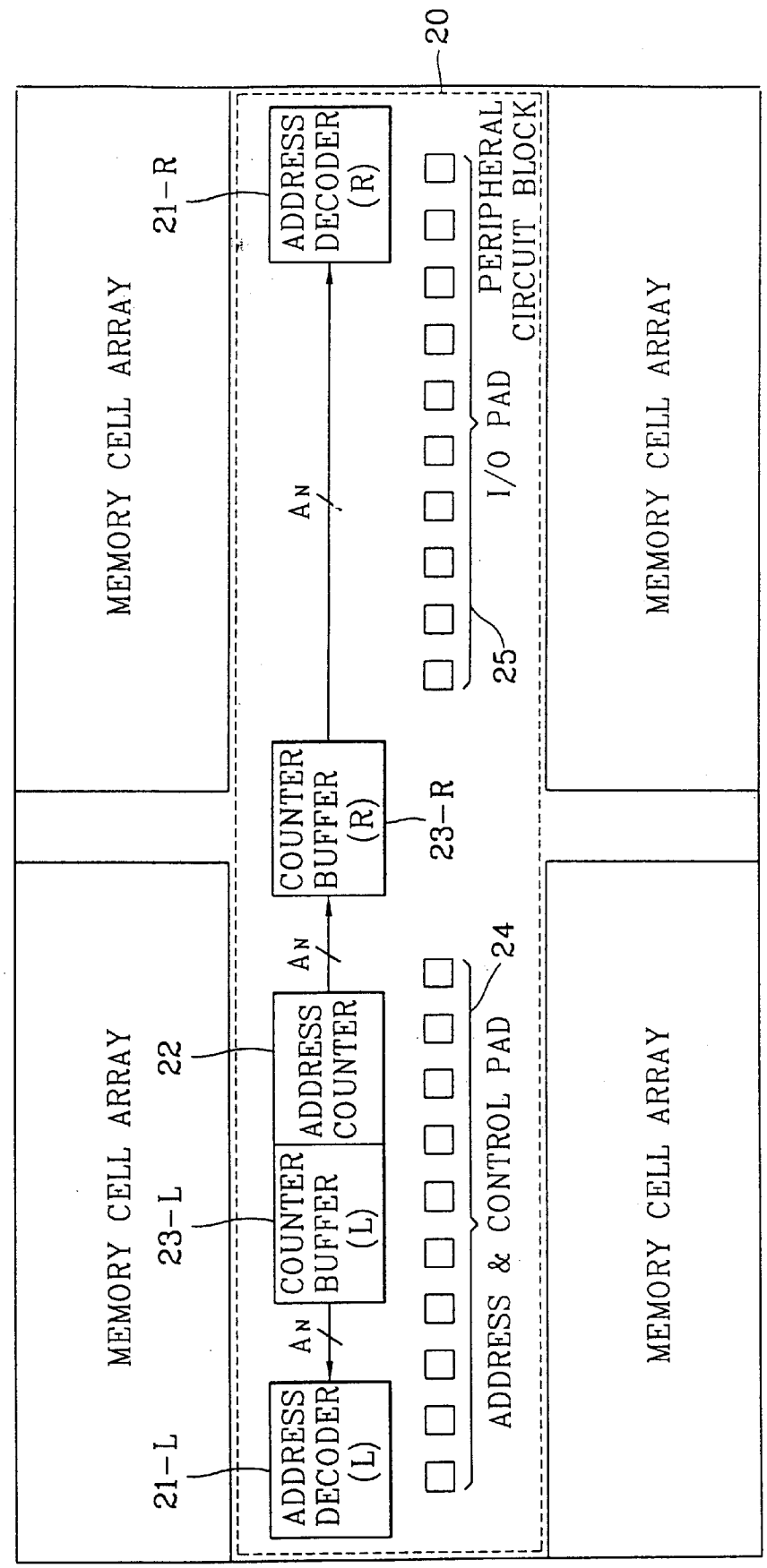
FIG. 2 is a block diagram illustrating the arrangement of a peripheral circuit block of a semiconductor memory in accordance with one embodiment of the present invention.

FIG. 2 illustrates a semiconductor memory in accordance with one embodiment of the present invention. As illustrated therein, the semiconductor memory is equipped with a peripheral circuit block 10 for applying data, control signals or address signals between a plurality of memory cell arrays. The peripheral circuit block 20 includes an input/output pad 25 for inputting and outputting data to be stored in memory cells, an address and control pad 24 for inputting an address signal and a control signal, an address counter 22 for counting the address signal, a first address counter buffer 23-L directly connected to an output terminal at the left side of the address counter 22 for buffering the address signal applied by the address counter 22, a second address counter buffer 23-R for buffering the address signal inputted from an output terminal at the right side of the address counter 22 through AN number of routes, and first and second address decoders for decoding the address signal and address decoders 11-L and 11-R for decoding the address signals inputted from the first and second address counter buffers 23-L and 23-R, respectively.

Herein, the first and second address counter buffers 23-L and 23-R do not exist together at the center of the chip, but the first address counter buffer 23-L is arranged to be connected to the output terminal at the left side of the address counter 22 and the second address counter buffer 23-R is arranged to be placed at the center of the chip in the same manner as the conventional art.

According to the arrangement thusly described, since the second address counter buffer 23-R has a larger load compared to the first address counter buffer 23-L, the left and right address counter buffers 23-L and 23-R must be differently constructed in order to compensate the difference.

A embodiment of the circuit of the first and second address counter buffers 23-L and 23-R is illustrated in FIG. 3.

Figure 3A:
FIG. 3 is a circuit diagram illustrating one embodiment of an address counter buffer circuit of FIG. 2.

FIG. 3(A) illustrates the second address counter buffer 23-R which includes an inverter INV1 for buffering an input signal in the same manner as the conventional art.

Figure 3B:
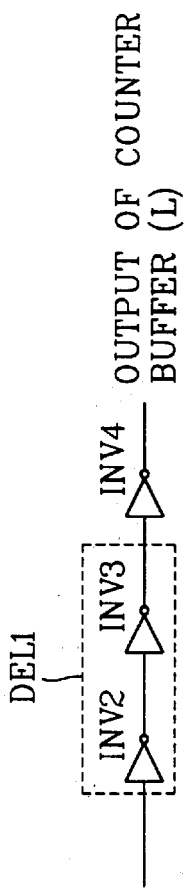
Figure 3C:
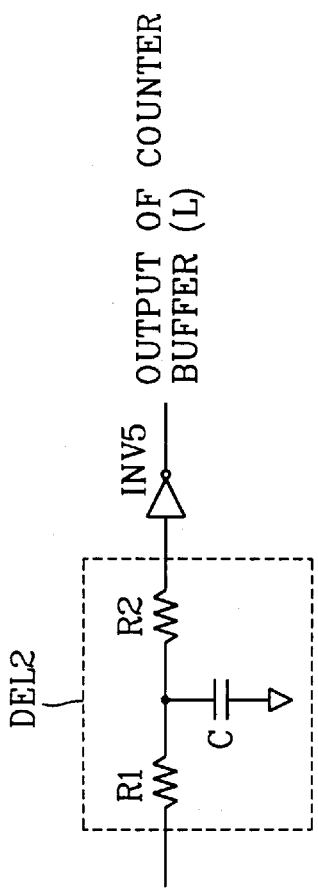

FIGS. 3(B) and 3(C) illustrates the embodiment of the first address counter buffer 23-L which additionally has delay circuits DEL1 and DEL2 so that it has the same delay time as the second address counter buffer 23-R. Each of the delay circuits DEL1 and DEL2 may include two inverters INV2 and INV3 as shown in FIG. 3(B), or may include a capacitor C connected to two resistors R1 and R2 as shown in FIG. 3(C).

The step of applying an address signal on the thusly constructed semiconductor memory circuit will be described as follows.

The address signal inputted through the address pad 24 is applied to the address counter 22 placed at the center of the pad, and the address signal outputted through the address counter is buffered by the first and second address counter buffers 23-L and 23-R to be applied to the left and right address decoders 21-L and 21-R, respectively.

Herein, the signal applied to the first address counter buffer 21-L is outputted as a signal with the same delay time as the output signal of the second address counter buffer 21-R by passing through the delay circuits DEL1 and DEL2 as shown in FIG. 3(C).

Accordingly, the output signals of the first and second address counter buffers 23-L and 23-R has the same delay time, and applied to the first and second address decoders 21-L and 21-R, respectively. By the first and second address decoders 21-L and 21-R accordingly enabled, the address signal is decoded for selecting a corresponding memory cell and thus writing data to and reading data from the selected memory cell.

As seen from above, in the case that a semiconductor memory chip is arranged and laid out, $2A_N$ number of routes at the left portion of the chip, at which the output of an address counter and the output of an address counter buffer overlap in the conventional art, is reduced to $A_N$ number of routes, thereby decreasing the size of the semiconductor memory chip.

What is claimed is:

1. A synchronous semiconductor memory chip with a Lead-On-Chip (LOC) architecture including a peripheral circuit block in which an address pad and an input/output pad are arranged at the left and right sides of a chip, respectively, the peripheral circuit comprising:

an address counter placed at the address pad, a first address decoder placed at the address pad;

a second address decoder is placed at the input/output pad;

a first address counter buffer for driving the first address decoder upon receipt of the output of the address counter, wherein the first address counter buffer is placed between the address counter and the first address decoder; and a second address counter buffer for driving for driving the second address decoder upon receipt of the output of the address counter, wherein the second address counter buffer is placed between the address counter and the second address decoder.

2. The circuit of claim 1, wherein the first and second counter buffers are configured and located so as to present the first and second address decoders, respectively, with the same delay time.

3. The circuit of claim 1, wherein the first address counter buffer includes an inverter and a delay circuit for buffering the output of the address counter with a predetermined delay time and outputting the same.

4. The circuit of claim 3, wherein the delay circuit is implemented as inverters, or as a combination of resistors and a capacitor.

5. The circuit of claim 1, wherein the second address counter buffer is constructed of an inverter for buffering the output of the address counter.

6. The circuit of claim 1, wherein the second address counter buffer is placed at the center of the chip.

7. The circuit of claim 1, wherein the address counter is placed at the center of the address pad.

8. The circuit of claim 1, wherein the first address counter buffer is arranged to abut the address counter.

* * * * *